United States Patent [19]

Toda

[11] Patent Number: 5,402,127

[45] Date of Patent: Mar. 28, 1995

[54] DIGITAL-TO-ANALOG CONVERTER

[75] Inventor: Akihiko Toda, Hamamatsu, Japan

[73] Assignee: Yamaha Corporation, Hamamatsu, Japan

[21] Appl. No.: 75,141

[22] Filed: Jun. 10, 1993

[30] Foreign Application Priority Data

Jun. 12, 1992 [JP] Japan .................. 4-153912

[51] Int. Cl.⁶ .......................... H03M 1/78; H03M 1/06
[52] U.S. Cl. ..................................... 341/154; 341/118
[58] Field of Search ............... 341/154, 118, 144, 155, 341/159, 120

[56] References Cited

U.S. PATENT DOCUMENTS

| | | | |
|---|---|---|---|
| 4,338,591 | 7/1982 | Tuthill | 341/118 X |
| 4,591,826 | 5/1986 | Seiler | 341/154 X |
| 4,983,973 | 1/1991 | Lewyn | 341/154 |
| 5,111,205 | 5/1992 | Morlon | 341/118 |

*Primary Examiner*—Sharon D. Logan
*Attorney, Agent, or Firm*—Spensley Horn Jubas & Lubitz

[57] ABSTRACT

A digital-to-analog converter (i.e., D/A converter) formed on a wafer comprises a decoder, transistors (e.g., field-effect transistors) and resistors. Since the wafer provides a gap between the p-well region and the n-well region, the resistance values of the resistors formed on the p-well region differ from those of the resistors formed on the n-well region. In order to cancel such difference between the resistance values, there are provided two series of resistors in parallel between a power-applying terminal and a ground terminal, wherein each of two series of resistors contain two kinds of resistors respectively formed on the p-well region and the n-well region, while a midpoint of the first series of resistors is connected with a midpoint of the second series of resistors. Due to the direct connection between two midpoints, the potential applied to these midpoints are stabilized and set at the certain fixed voltage. Thus, it is possible to obtain a desirable precision for the linear digital-to-analog conversion characteristic of the D/A converter, regardless of the difference between the resistance values of the resistors respectively formed on the p-well region and n-well region on the wafer.

6 Claims, 5 Drawing Sheets

DIGITAL-TO-ANALOG CONVERTER

BACKGROUND OF THE INVENTION

The present invention relates to a digital-to-analog converter which is suitable for use in the semiconductor integrated circuits and the like.

FIG. 3 shows an example of the digital-to-analog converter (hereinafter, simply referred to as a D/A converter). Herein, 3 designates a D/A converter as a whole, wherein an input digital signal is converted into an analog signal to be outputted. In general, this D/A converter 3 is configured by the CMOS integrated circuits, and this type of D/A converter is called a resistance-dividing-type converter.

Next, 4 designates a decoder which has three inputs and eight outputs. More specifically, three inputs of this decoder 4 are respectively designated by numerals "I30", "I31", "I32", to which signals S30, S31, S32 are respectively supplied. Herein, the signals S30, S31, S32 respectively correspond to three bits which are disposed in a digit-place-ascending order of the predetermined binary notation, so that the signal S30 corresponds to the bit of the lowest digit position, while the signal S32 corresponds to the bit of the highest digit position. Similarly, eight outputs of the decoder 4 are respectively designated by numerals T30, T31, T32, T38, T34, T35, T36 and T37 which respectively correspond to eight bits in a digit-place-ascending order of the predetermined binary notation. In response to the combination of the digits (i.e., 0 or 1) which are respectively applied to three inputs I30–I32 of the decoder 4, one of the outputs T30 through T37 is selected. Incidentally, this combination of the digits applied to three inputs I30–I32 of the decoder 4 will be represented by a signal value "va13". When one of the outputs T30–T33 is selected, a signal having a high logical level (hereinafter, simply referred to as a 1-level signal) is outputted. On the other hand, when one of the other outputs T34–T37 is selected, a signal having a low logical level (hereinafter, simply referred to as a 0-level signal) is outputted.

Next, F30 through F37 designate field-effect transistors (i.e., FETs). Among them, F30 through F33 designate n-channel FETs which are formed on a p-well region surrounded by a dotted line P3 in FIG. 3. Normally, the 0-level signal is applied to each of the gates of the FETs F30 through F33. When the 1-level signal is applied to the gate, each of these FETs is set in an on-state. On the other hand, F34 through F37 designate p-channel FETs, which are formed on a n-well region surrounded by a dotted line n3 in FIG. 3. Normally, the 1-level signal is applied to each of the gates of the FETs F34 through F37. When the 0-level signal is applied to the gate, each of these FETs is set in an on-state. FIG. 4 shows an example of the construction of the field-effect transistors, wherein a numeral 4a represents the n-channel FET (i.e., F30–F33), while another numeral 4b represents the p-channel FET (i.e., F34–F37).

In FIG. 3, 30–37 designate resistors; E3 designates a power-voltage terminal; and GND3 designates a ground terminal. The resistors 30–37 are arranged to be related with the FETs F30–F37 respectively. Normally, the voltage of "+5V" is applied to the terminal E3. Therefore, the potential is equal to +2.5V at a point PT3 which is positioned among the FET F34 and resistors 33, 34.

In FIG. 3, a numeral "out3" designates the output signal of the D/A converter 3.

In the D/A converter 3 having the above-mentioned configuration, when the foregoing signal value va13 is set at the predetermined value represented by a 3-bit binary code "000", the output T30 of the decoder 4 is selectively activated so that its signal level is put on the logical level 1, resulting that the FET F30 is selectively turned on. At this time, the voltage at the terminal GND3 is applied to the output signal out3.

In the meantime, when the signal value va13 is set at another value represented by a binary code "100", the output T34 of the decoder 4 is turned to be at the logical level 0, resulting that the FET F34 is turned on. Since the potential difference (normally, 5V) applied between the terminals E3 and GND3 is equally divided by eight resistors 30–37, the voltage of 2.5V is ideally applied to the output signal out3.

Meanwhile, in the aforementioned D/A converter 3, the resistors 30–33 are positioned on the p-well region, while the other resistors 34–37 are positioned on the n-well region. However, in the D/A converter, there exists a deviation (or unstableness) among the resistance values of the resistors 30–33 and the resistors 34–37. This means that the desirable resistance values cannot be obtained with accuracy because of the following two reasons.

Firstly, there is formed a gap (or stage difference, i.e., height difference) between the p-well region and n-well region (see FIG. 4). The formation of the gap results from the characteristic of the silicon dioxide region, such as LOCOS (i.e., Local Oxidation of Silicon), which is provided between the p-well region and the n-well region. The gap is used for aligning the mask on the semiconductor wafer. In short, the gap is an essential element for the photolithography process. As a result, even if the width of the pattern on the reticle is the same, there must be occurred a small difference between the widths of the resistance patterns by the so-called multireflection effect which is occurred at the inside of the film when performing the photolithography technique in the manufacturing process. Thus, the resistors on the p-well region are formed at the higher positions (or lower positions) as compared to the resistors on the n-well region. When such height difference among the resistors is relatively large, the resistance values of the resistors formed on the p-well region become higher than those of the resistors formed on the n-well region, and consequently, it becomes impossible to obtain the accurate analog output. Such difference (or disparity) between the resistance values of the resistors is frequently occurred particularly in the gap portion. FIG. 5 is a graph showing the resistance values of the resistors 30–37 in connection with the positions of the resistors formed between the ground terminal GND3 and the power-supplying terminal E3. As is understood from the graph shown in FIG. 5, each of the resistance values of the resistors 30–33 and 34–37 changes at a point PT3. In FIG. 5, a difference between the resistance values is represented by "$\Delta E1$". As described before, such difference between the resistance values may deteriorate the characteristic of the D/A converter. In FIG. 6 showing a relationship between the digital input and the analog output of the D/A converter, a solid line represents an actual characteristic, while a dotted line represents an ideal characteristic which must be illustrated by a linear curve. As shown in FIG. 6, the actual characteristic is deviated from the ideal characteristic. Herein, the maximum deviation is represented by "ΔEa" which corresponds to "ΔE1" representing the difference between the resistance values. In short, there is a drawback in that the sufficient precision for the linear D/A conversion characteristic cannot be obtained.

Secondly, there is a certain distribution of the resistance values of the resistor pattern on the surface of the wafer. An example of such distribution manner is shown by a graph of FIG. 2A. Such uneven thickness of the thin film in which the resistor patterns are manufactured results in the above-mentioned distribution of the resistance values caused by the manufacturing process to be actually carried out. Therefore, the resistance values for the D/A converter 3 are gradually reduced in the right-side positions as shown in FIG. 2A, for example. According to such distribution of the resistance values, the resistance value of the resistor 30 is the highest among the resistors 30–37; the resistance values of the resistors 31, 32 are lower than the resistor 30; the resistance values are gradually reduced in the resistors 30–37; and the resistance value of the resistor 37 is the lowest. In FIG. 2A, "ΔEb" represents a difference among the resistance values due to the uneven thickness of the thin film in the resistor pattern. Such difference among the resistance values may deteriorate the characteristic of the D/A converter. In FIG. 2B showing a relationship between the digital input and the analog output of the D/A converter, a solid line represents an actual characteristic of the D/A converter, while a dotted line represents an ideal characteristic of the D/A converter which is represented by a linear curve. As shown in FIG. 2B, the actual characteristic deviates from the ideal characteristic. The maximum deviation between them can be represented by $\mp\Delta Eb/2$", for example. When the disparity of the resistance values of the resistors 30–37 is relatively large, it is not possible to set the level of the output signal out3 at the predetermined level with accuracy. For this reason, there is a drawback in that the sufficient linear D/A conversion characteristic cannot be obtained.

SUMMARY OF THE INVENTION

Accordingly, it is a primary object of the present invention to provide a D/A converter which has an improved linear D/A conversion characteristic, regardless of the effects of the manufacturing process of the semiconductor device.

The present invention relates to a D/A converter which is fabricated in a semiconductor device formed on a wafer providing a p-well region and a n-well region between which a gap is also formed. According to an aspect of the present invention, there are provided a D/A converter at least comprising two series of resistors, transistors and a decoder. Each of two series of resistors contain two kinds of resistors respectively formed on the p-well region and n-well region, and each of two series of resistors are respectively connected in series between a power-applying terminal and a ground terminal. The transistors (e.g., field-effect transistors) contain two kinds of transistors which are respectively formed on the p-well region and n-well region. The transistors formed on the p-well region are respectively connected in parallel with some of the first series of resistors which are formed on the p-well region, while the other transistors formed on the n-well region are respectively connected in parallel with the other of the first series of resistors which are formed on the n-well region. There is formed a midpoint between the resistors respectively formed on the p-well region and n-well region with respect to each of two series of resistors. Then, the midpoint of the first series of resistors is directly connected with the midpoint of the second series of resistors, and consequently, the potential applied to these midpoints are stabilized and set at the certain fixed voltage.

In the above-mentioned configuration, one of the transistors is selectively turned on by the decoder to which a digital input is supplied. Thus, the potential appeared on the electrode of the transistor which is turned on is picked up as an analog output corresponding to the foregoing digital input.

BRIEF DESCRIPTION OF THE DRAWINGS

Further objects and advantages of the present invention will be apparent from the following description, reference being had to the accompanying drawings wherein the preferred embodiment of the present invention is clearly shown.

In the drawings.

DESCRIPTION OF THE PREFERRED EMBODIMENT

A Configuration

Figure 1:
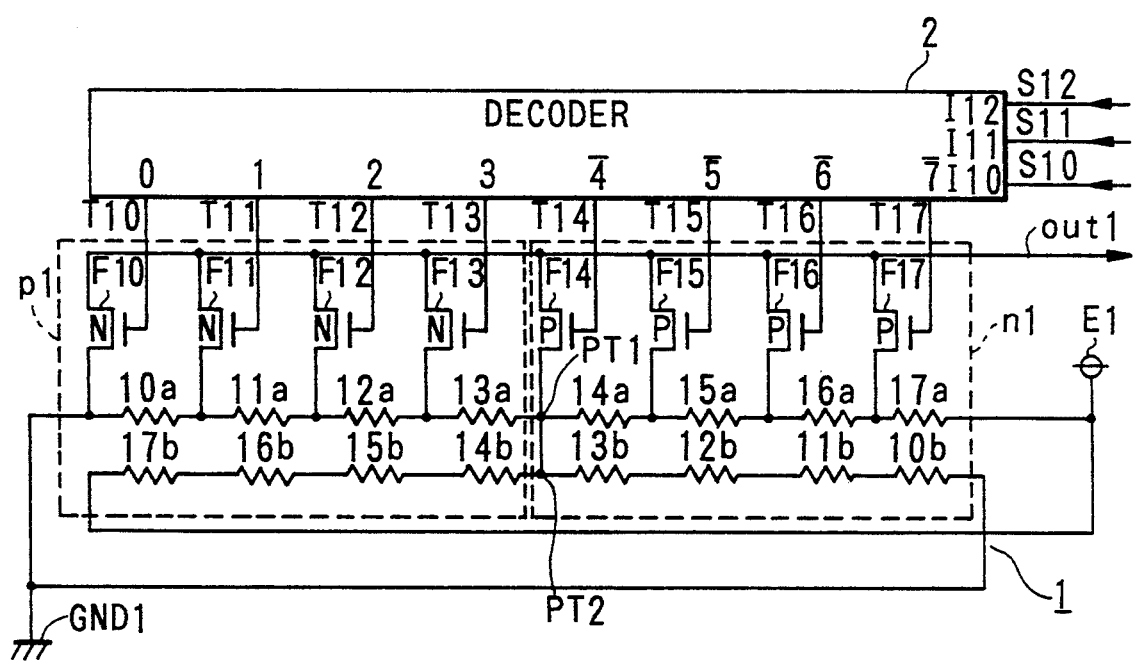
FIG. 1 is a circuit diagram showing an electric configuration of the D/A converter according to an embodiment of the present invention.

FIG. 1 shows a D/A converter of which configuration is designed according to the present invention. In FIG. 1, 1 designates a D/A converter, which is generally used for the CMOS integrated circuits. As described before, this type of D/A converter is classified as one of the foregoing resistance-dividing-type converters. This D/A converter 1 converts the input digital signal into the analog signal to be outputted. Next, 2 designates a decoder which has three inputs and eight outputs. Three inputs of this decoder 2 are respectively represented by numerals I10, I11, I12, to which signals S10, S11, S12 are respectively supplied. As described before, these inputs I10–I12 correspond to three bits which are arranged in a digit-place-ascending order of the binary notation, so that the input I10 corresponds to the lowest digit place, while the input I12 corresponds to the highest digit place.

Moreover, eight outputs of the decoder 2 are respectively designated by numerals T10, T11, T12, T13, T14, T15, T16, T17 which are disposed in a digit-place-ascending order of the binary notation, so that the output T10 corresponds to the lowest digit place, while the output T17 corresponds to the highest digit place. One of these outputs T10–T17 is selected in response to the combination of the values (i.e., logical level 1 or 0) supplied to the inputs I10–I12 (hereinafter, this combination of the values will be represented by a signal value "val1"). Incidentally, the foregoing 1-level signal is outputted when the outputs T10–T13 are set in the on-state, while the foregoing 0-level signal is outputted when the outputs T14–T17 are set in the on-state.

Figure 4:
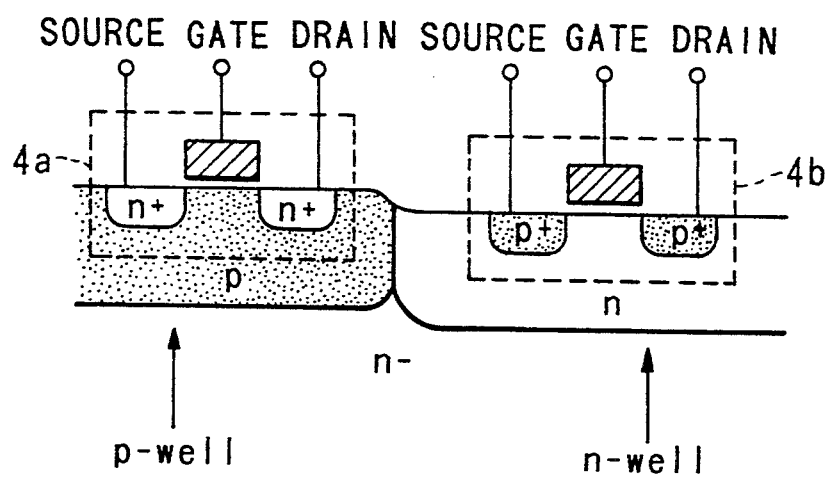
FIG. 4 is a sectional view illustrating the electronic configurations of the n-channel FET and p-channel FET.
Figure 5:
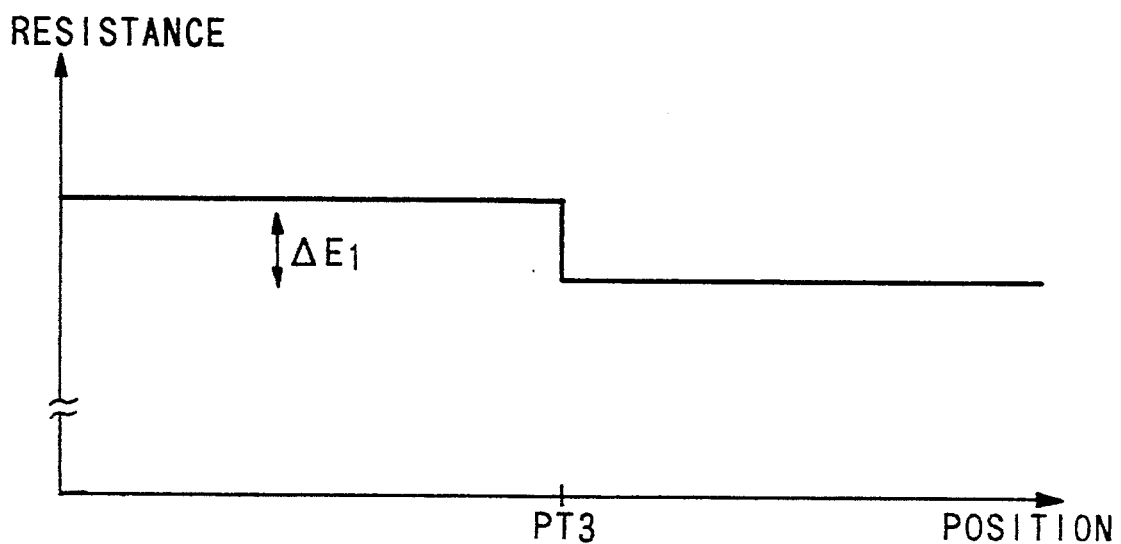
FIG. 5 is a graph showing a relationship between the resistance of the resistor and its position.
Figure 6:
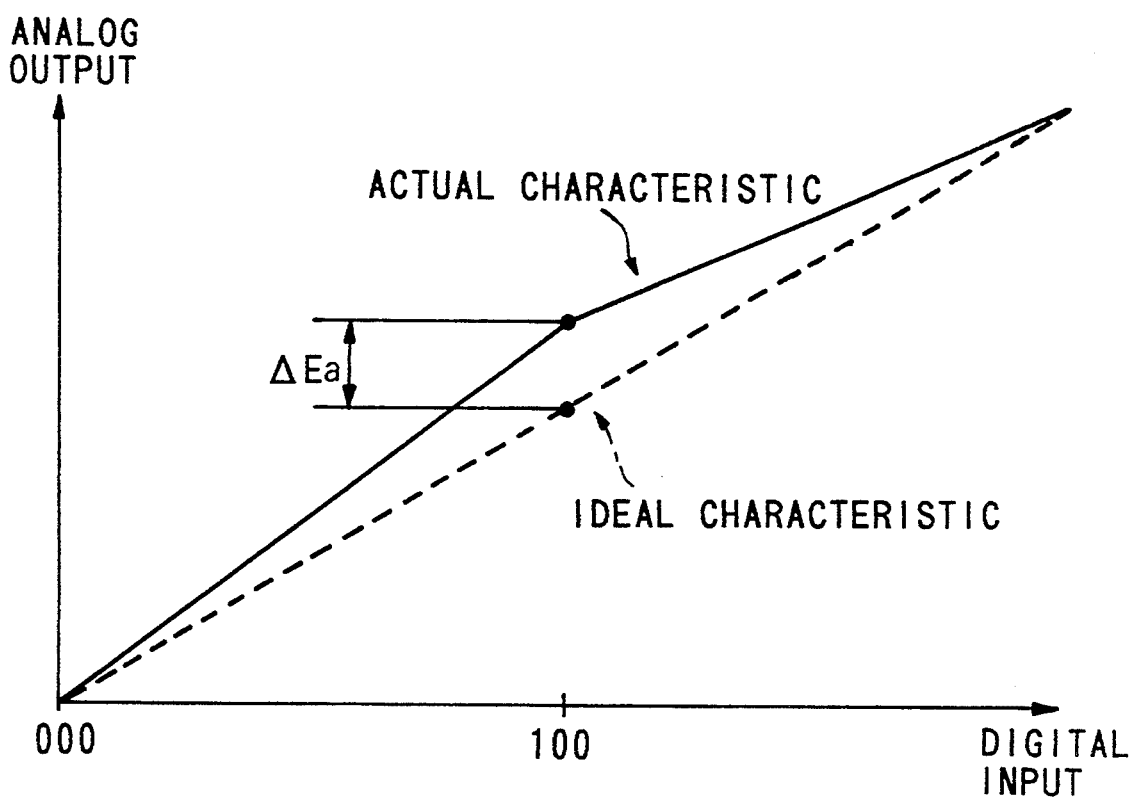
FIG. 6 is a graph showing a relationship between a digital input and an analog output of the D/A converter.

Next, numerals F10–F17 designate FETs. Among them, the numerals F10–F13 designate the n-channel FETs which are formed on the p-well region surrounded by a dotted line p1 in FIG. 1. Normally, the logical level 0 is applied to each of the gates of the FETs F10–F13. Therefore, when this logical level is changed to the logical level 1 to be applied to the gate, each of the FETs F10–F13 is turned on. On the other hand, the other numerals F14–F17 designate the p-channel FETE which are formed on the n-well region surrounded by a dotted line n1. Normally, the logical level 1 is applied to each of the gates of the FETs F14–F17. When this logical level is changed so that the logical level 0 is applied to the gate, each of the FETs F14–F17 is turned on. The above-mentioned n-channel FET (i.e., F10–F13) can be represented by the foregoing FET 4a, while the p-channel FET (i.e., F14–F17) can be represented by the foregoing FET 4b (see FIG. 4).

Next, E1 designates a power-voltage terminal (i.e., a terminal applied with a higher potential) to which the voltage of "+5V" is applied, while GND1 designates a ground terminal (i.e., a terminal applied with a lower potential). Further, numerals 10a–17a and 10b–17b designate resistors. As shown in FIG. 1, a midpoint PT1 formed between the resistors 13a, 14a is linked with a midpoint PT2 formed between the resistors 13b, 14b and the FET F14.

The above-mentioned resistors 10a–13a and 14b–17b are arranged on the p-well region, while the other resistors 14a14 17a and 10b–13b are arranged on the n-well region. The resistors 10a–17a are arranged to be connected to the FETs F10–F17.

Since a group of the resistors 10a–13a is arranged on the p-well region and another group of the resistors 14a–17a is arranged on the n-well region, there is occurred a resistance difference (or disparity of the resistance values) between these groups of the resistors. Similarly, a group of the resistors 10b–13b is arranged on the n-well region and another group of the resistors 14b–17b is arranged on the p-well region. The ground terminal GND1 is connected to one end of a series of resistors 10a–13a (i.e., an end portion near the resistor 10a), and it is also connected to another end of a series of resistors 10b–13b (i.e., an end portion near the resistor 10b). On the other hand, the power-supply terminal E1 is connected to one end of a series of resistors 14a–17a (i.e., an end portion near the resistor 17a), and it is also connected to another end of a series of resistors 14b–17b (i.e., an end portion near the resistor 17b). The group of the resistors 10a–13a arranged on the p-well region and another group of the resistors 10b–13b arranged on the n-well region are connected together in parallel with respect to the midpoints PT1, PT2 and the ground terminal GND1. Similarly, the group of the resistors 14a–17a arranged on the n-well region and another group of the resistors 14b–17b arranged on the p-well region are connected together in parallel with respect to the midpoints PT1, PT2 and the power-voltage terminal E1. Under effect of the parallel connection between two groups of the resistors which are respectively provided on the different types of the well regions, a composite resistance of the parallel-connected resistors 10a–13a and 10b–13b is equalized with a composite resistance of the parallel-connected resistors 14a–17a, 14b–17b. As a result, the resistance difference between them (due to the gap between the p-well region and the n-well region) will be eventually canceled, so that an undesirable effect due to the resistance difference can be eliminated in the D/A converter.

B Operation

In the circuitry shown in FIG. 1, when the power voltage is applied to the terminal E1, this circuitry (i.e., D/A converter 1) starts to perform the D/A conversion by which the digital input is converted into the analog output.

In some cases, the width of the resistor pattern formed on the p-well region is different from the width of the resistor pattern formed on the n-well region as described before. The resistors 10a–13a and 14b–17b correspond to the resistor pattern formed on the p-well region, while the other resistors 14a–17a and 10b–13b correspond to the resistor pattern formed on the n-well region.

However, when the aforementioned midpoints PT1, PT2 are connected together, the same potential is applied to these midpoints PT1, PT2. Due to the connection of the resistors 10a–17a, 10b–17b, the potential at the midpoints PT1, PT2 are set at +2.5V.

As described before, the resistance difference to be occurred between the resistors respectively formed on the p-well region and n-well region due to the gap between the p-well region and the n-well region is canceled by the foregoing parallel connection as shown in FIG. 1, while the midpoints PT1, PT2 are connected together so that the same potential is applied to them. Due to the effects of the above-mentioned connecting manner of the resistors, it is possible to improve the linear D/A conversion characteristic of the D/A converter as compared to the D/A converter, as shown in FIG. 8, which does not provide with the resistors 10b–17b.

When the signal value val1 of which binary code is represented by "000" is supplied to the D/A converter 1, the output T10 of the decoder 2 is subjected to the logical level 1, so that the FET F10 is turned on. At this time, the output signal out1 is set at a value equivalent to the voltage of 0V at the terminal GND1.

In contrast, when the signal value val1 of which binary code is represented by "100" is supplied to the D/A converter 1, the output T14 of the decoder 2 is subjected to the logical level 0, so that the FET F14 is turned on. Since the resistance difference between the resistors respectively formed on the p-well region and n-well region is canceled, the output signal out1 is set at a value equivalent to the voltage of +2.5V.

Next, the description will be given with respect to the case where the certain distribution characteristic is set for the resistance values of the resistors formed on the surface of the wafer. According to this distribution characteristic, the resistance is gradually reduced from the left-side resistor to the right-side resistor in FIG. 1, for example. More specifically, there is established a certain relationship among the resistance values of the resistors as follows:

$10a = 17a > 11a = 16b > \ldots 16a = 11b > 17a = 10b$

According to the above-mentioned relationship, the resistance of the resistor 10a is set equal to that of the resistor 17a, but his resistance is set larger than the resistance of the resistors 11a, 16b, for example.

Figure 2:
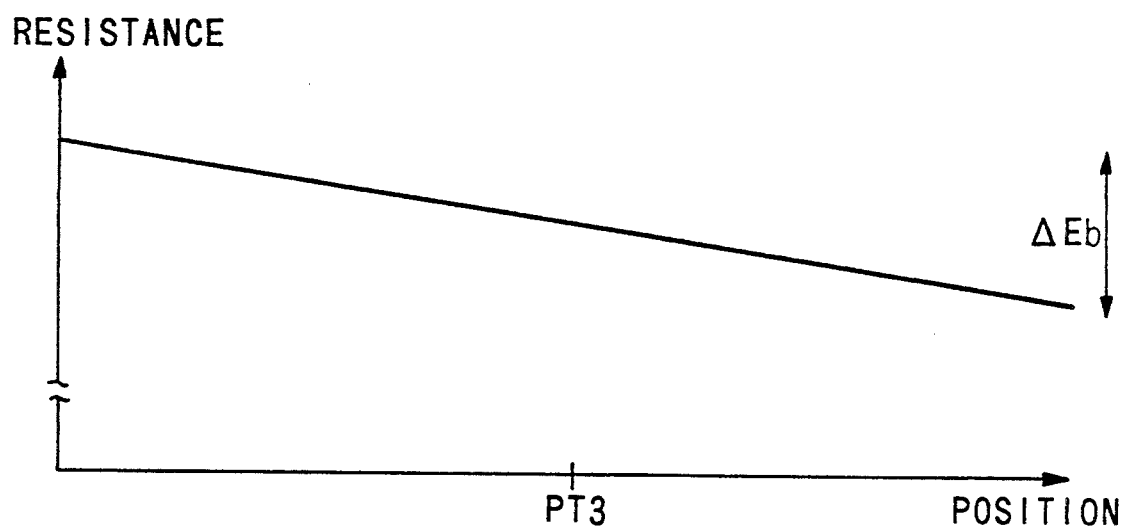
FIG. 2A is a graph showing an example of a distribution of the resistance values of the resistors which are linearly disposed on a surface of a wafer.
FIGS. 2B and 2C are graphs each showing a relationship between a digital input and an analog output of the D/A converter.
Figure 2:
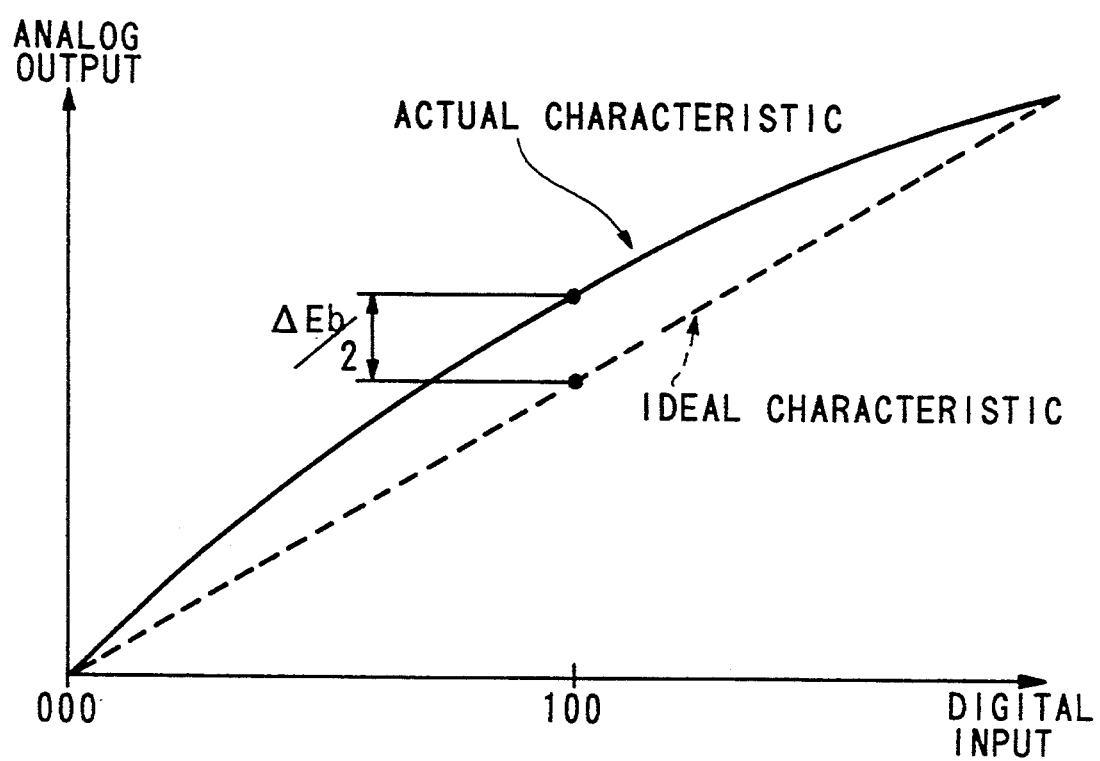
Figure 2:
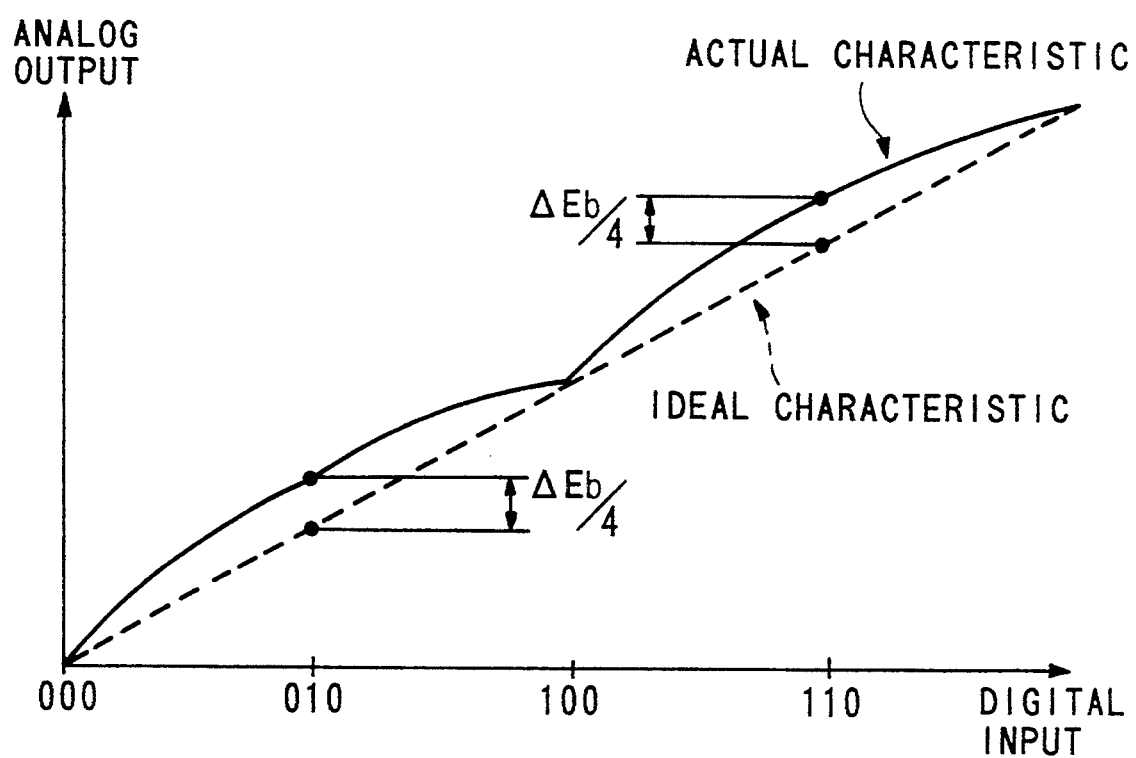
Figure 3:
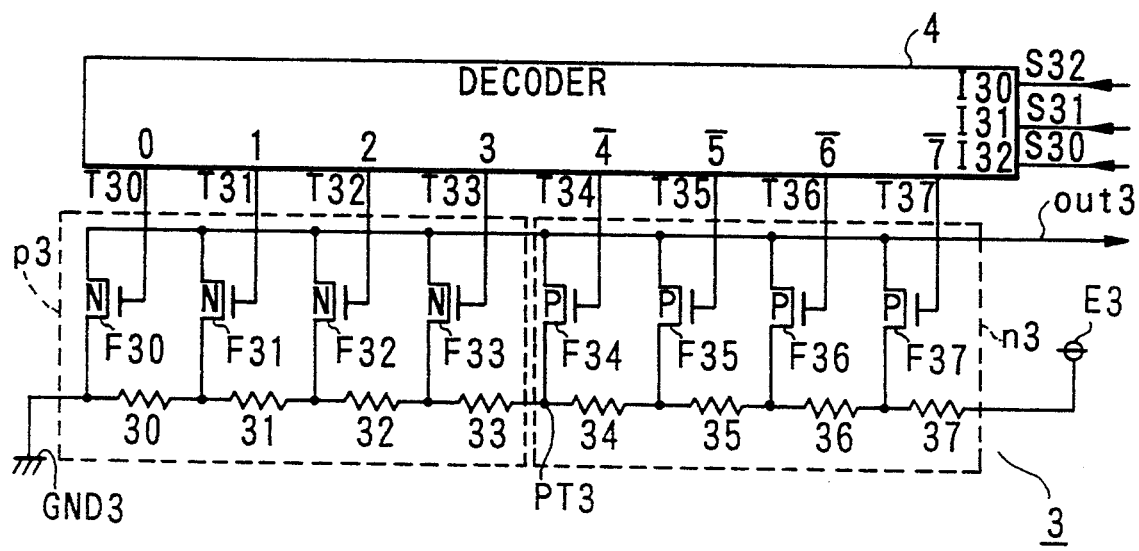
FIG. 3 is a circuit diagram showing an example of the D/A converter of which configuration is described as the background of the invention.

As described before, two midpoints PT1, PT2 are connected together so that the same potential is applied to them, while the parallel-connection relationship is established for the resistors 10a–17a, 10b–17b as shown in FIG. 1. Thus, the same potential of +2.5V is applied to these midpoints PT1, PT2. Meanwhile, these midpoints can be defined as the resistance-dividing points, therefore, there are existed the other resistance-dividing points (e.g., a point between the resistors 10a, 11a and another point between the resistors 16b, 17b). In this case, there is inevitably occurred a certain potential difference between the corresponding two resistance-dividing points. However, since the predetermined resistance-dividing points (i.e., midpoints PT1, PT2) are connected together so that the potential difference between them is canceled as described before, the output level of the D/A converter 1 can be stabilized. FIG. 2C is a graph showing an actual characteristic of the D/A converter (see a solid curve) and an ideal characteristic of the D/A converter (see a dotted curve) which is represented by a linear curve. In FIG. 2C, the maximum deviation between the actual characteristic of the D/A converter and the ideal characteristic of the D/A converter can be represented by "$\Delta Eb/4$". When comparing two graphs shown in FIGS. 2B and 2C, it is possible to understand that the deviation between the actual characteristic of the D/A converter and the ideal characteristic of the D/A converter (which is occurred due to the gap between the p-well region and the n-well region) is reduced (or partially canceled) by the present embodiment. As a result, the precision for the linear D/A conversion characteristic can be improved as compared to the conventional D/A converter 3 which does not provide with the resistors 10b–17b.

Incidentally, the present embodiment is designed for use in the CMOS integrated circuits. However, the fundamental configuration of the present invention can be applied to the other integrated circuits such as the NMOS integrated circuits and PMOS integrated circuits, each of which employs the certain resistor-pattern layout. In such cases, it is possible to improve the precision for the linear D/A conversion characteristic of the D/A converter.

Lastly, this invention may be practiced or embodied in still other ways without departing from the spirit or essential character thereof as described heretofore. Therefore, the preferred embodiment described herein is illustrative and not restrictive, the scope of the invention being indicated by the appended claims and all variations which come within the meaning of the claims are intended to be embraced therein.

What is claimed is:

1. A digital-to-analog converter which is fabricated in a semiconductor device formed on a wafer providing a p-well region and a n-well region comprising:
   a first group of resistors providing two end portions, in which one end portion is connected to a lower-potential terminal, while another end portion is connected to a predetermined center point;
   a second group of resistors providing two end portions, in which one end portion is connected to a higher-potential terminal, while another end portion is connected to the predetermined center point;
   first and second groups of transistors each providing first, second and third electrodes, said first group of transistors being formed on the p-well region, said second group of transistors being formed on the n-well region, all of said second electrodes of said first and second groups of transistors being connected together, said first group of resistors being connected in parallel with said first group of transistors such that each of said first group of resistors is connected between two first electrodes of said first group of transistors, said second groups of resistors being connected in parallel with said second group of transistors such that each of said second group of resistors is connected between two first electrodes of said second group of transistors;
   a transistor turn-on means for selecting one of said plurality of transistors in response to a digital input so as to apply a signal to said third electrode of the selected transistor so that the selected transistor is turned on; and
   a resistance-difference canceling means which is formed over said p-well region and said n-well region and connected with said lower-potential terminal, said higher-potential terminal and said predetermined center point, said resistance-difference canceling means canceling a difference between resistance values of said resistors which are respectively formed on said p-well region and said n-well region,
   whereby a potential corresponding to the selected transistor is picked up from said second electrode as an analog output corresponding to the digital input.

2. A digital-to-analog converter as defined in claim 1 wherein each of said transistors is a field-effect transistor so that said first, second and third electrodes correspond to source, drain and gate respectively.

3. A digital-to-analog converter as defined in claim 1 wherein said resistance-difference canceling means further comprises:
   a third group of resistors formed on said p-well region and providing two end portions, in which one end portion is connected to said higher-potential terminal, while another end portion is connected to said center point; and
   a fourth group of resistors formed on said n-well region and providing two end portions, in which one end portion is connected to said lower-potential terminal, while another end portion is connected to said center point.

4. A digital-to-analog converter as defined in claim 1 wherein said lower-potential terminal is a ground terminal, while said higher-potential terminal is a power-supplying terminal.

5. A digital-to-analog converter which is fabricated in a semiconductor device formed on a semiconductor wafer having a p-well region and a n-well region, comprising:
   a first group of resistors providing two end portions, in which one end portion is connected to a lower-potential terminal, while another end portion is connected to a predetermined center point, said first group of resistors being formed on said p-well region;

a second group of resistors providing two end portions, in which one end portion is connected to a higher-potential terminal, while another end portion is connected to the predetermined center point, said second group of resistors being formed on said n-well region;

a decoding means for decoding a digital signal in response to input signals applied thereto;

a plurality of switches which are connected with said decoding means and said first and second groups of resistors, said switches functioning to output an analog signal in response to a decoded digital signal; and a resistance-difference canceling means which is formed over said p-well region and said n-well region and connected with said lower-potential terminal, said higher-potential terminal and said center point, said resistance-difference canceling means canceling a difference between resistance values of said resistors which are respectively formed on said p-well region and said n-well region.

6. A digital-to-analog converter as defined in claim 5 wherein said resistance-difference canceling means further comprises:

a third group of resistors formed on said p-well region and providing two end portions, in which one end portion is connected to said higher-potential terminal, while another end portion is connected to said center point; and a fourth group of resistors formed on said n-well region and providing two end portions, in which one end portion is connected to said lower-potential terminal, while another end portion is connected to said center point.

* * * * *